(12) United States Patent
Welty et al.

(10) Patent No.: US 6,399,219 B1
(45) Date of Patent: *Jun. 4, 2002

(54) ARTICLE HAVING A DECORATIVE AND PROTECTIVE COATING THEREON

(75) Inventors: Richard P. Welty; Patrick A. Sullivan, both of Boulder, CO (US); John Finch, Livonia, MI (US)

(73) Assignee: Vapor Technologies, Inc., Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/471,928

(22) Filed: Dec. 23, 1999

(51) Int. Cl.7 .............................................. G32B 15/08
(52) U.S. Cl. ..................... 428/626; 428/412; 428/457; 428/458; 428/461; 428/469; 428/472; 428/474.4; 428/698; 428/699; 428/701
(58) Field of Search ................................ 428/698, 697, 428/699, 701, 472, 412, 458, 461, 474.4, 469, 626, 457

(56) References Cited

U.S. PATENT DOCUMENTS

| | | |
|---|---|---|
| 3,838,512 A | 10/1974 | Sanderson |
| 3,977,839 A | 8/1976 | Palisin, Jr. |
| 4,109,052 A | 8/1978 | Anderson |
| 4,148,967 A | 4/1979 | Satoh et al. |
| 4,305,981 A | 12/1981 | Muroi et al. |
| 4,321,299 A | 3/1982 | Frazer |
| 4,369,225 A | 1/1983 | Manabe et al. |
| 4,374,717 A | 2/1983 | Drauglis et al. |
| 4,591,418 A | 5/1986 | Snyder |
| 4,911,811 A | 3/1990 | Mullaney, Jr. |
| 4,931,366 A | 6/1990 | Mullaney, Jr. |
| RE34,173 E | 2/1993 | Kerber |
| 5,482,788 A | 1/1996 | Moysan, III et al. |
| 5,484,663 A | 1/1996 | Moysan, III et al. |
| 5,510,164 A | 4/1996 | Best et al. |
| 5,552,233 A | 9/1996 | Moysan, III et al. |
| 5,589,280 A | 12/1996 | Gibbons et al. |
| 5,626,972 A | 5/1997 | Moysan, III et al. |
| 5,639,564 A | 6/1997 | Moysan, III et al. |
| 5,641,579 A | 6/1997 | Moysan, III et al. |
| 5,648,179 A | 7/1997 | Moysan, III et al. |
| 5,654,108 A | 8/1997 | Moysan, III et al. |
| 5,656,335 A | 8/1997 | Schwing et al. |
| 5,922,478 A | 7/1999 | Welty et al. |
| 5,948,548 A | 9/1999 | Welty et al. |
| 6,090,490 A | 7/2000 | Mokerji |
| 6,096,426 A | 8/2000 | Mokerji |
| 6,103,381 A | 8/2000 | Mokerji |
| 6,132,889 A | 10/2000 | Welty et al. |
| 6,143,424 A | 11/2000 | Jonte et al. |
| 6,168,242 B1 | 1/2001 | Mokerji |

*Primary Examiner*—Archene Turner
(74) *Attorney, Agent, or Firm*—Myron B. Kapustij; Lloyd D. Doigan

(57) ABSTRACT

An article is coated with a multi-layer coating comprising a polymeric layer; a chromium compound, preferably chromium nitride layer; a sandwich layer comprised of a plurality of alternating layers comprised of refractory metal compound or refractory metal alloy compound alternating with layers comprised of refractory metal or refractory metal alloy; a color layer comprised of chromium, metal compound or metal alloy compound; and (i) a metal oxide or metal alloy oxide layer or (ii) a layer comprised of the reaction products of metal or metal alloy, oxygen and nitrogen. The coating provides abrasion protection, corrosion protection, and improved chemical resistance.

18 Claims, 2 Drawing Sheets

ARTICLE HAVING A DECORATIVE AND PROTECTIVE COATING THEREON

FIELD OF THE INVENTION

This invention relates to articles with a multi-layer decorative and protective coating thereon.

BACKGROUND OF THE INVENTION

It is currently the practice with various articles, particularly brass articles such as faucets, faucet escutcheons, door knobs, door handles, door escutcheons and the like, to first buff and polish the surface of the article to a high gloss and then apply a protective organic coating, such as one comprised of acrylics, urethanes, epoxies, and the like, onto this polished surface. This system has the drawback that the buffing and polishing operation, particularly if the article is of a complex shape, is labor intensive. Also, the known organic coatings are not always as durable as desired, and are susceptible to attack by chemicals such as acids. It would, therefore, be quite advantageous if brass articles, or indeed other articles, either plastic, ceramic, or metallic, could be provided with a coating which gave the article the appearance of highly polished brass, provided wear resistance and corrosion protection, and also provided improved chemical, such as acid, resistance. The present invention provides such a coating.

SUMMARY OF THE INVENTION

The present invention is directed to an article such as a plastic, ceramic, or metallic, particularly a metallic article, having a multi-layer coating deposited on at least a portion of its surface. More particularly, it is directed to an article, particularly a metallic article such as stainless steel, aluminum, brass or zinc, having deposited on its surface multiple superposed layers of certain specific types of materials. The coating is decorative and also provides corrosion resistance, wear resistance and improved chemical resistance such as improved resistance to acids and bases. In one embodiment the coating provides the appearance of highly polished brass, i.e. has a brass color tone, while in another embodiment it provides a chrome color.

The article has deposited on its surface a polymeric base coat layer. The polymeric base coat layer functions to level the surface of the article, cover any scratches or imperfections in the surface of the article, and provide a smooth and even surface for the deposition of the subsequent layers of the multi-layered coating.

In one embodiment deposited over the polymeric base coat layer is an adhesion promoting layer comprised of chromium. Over the adhesion promoting chromium layer is deposited a relatively thick strengthening layer comprised of chromium compound. Over the chromium compound strengthening layer is a sandwich layer comprising a multiplicity of alternating layers of a refractory metal compound or refractory metal alloy compound and a refractory metal or refractory metal alloy. Over the sandwich layer is a color layer comprising a metal or metal alloy such as chromium or stainless steel, or a reacted metal compound such as zirconium nitride or titanium-zirconium carbonitride. In one embodiment over the color layer is a transparent protective metal compound layer.

In another embodiment the adhesion promoting chromium layer is absent and the chromium compound strengthening layer is deposited directly onto the polymeric base coat layer.

All metal and reacted metal compound layers are deposited by a vapor deposition method such as physical vapor deposition including cathodic arc evaporation and sputtering.

DESCRIPTION OF THE PREFERRED EMBODIMENT

Figure 1:
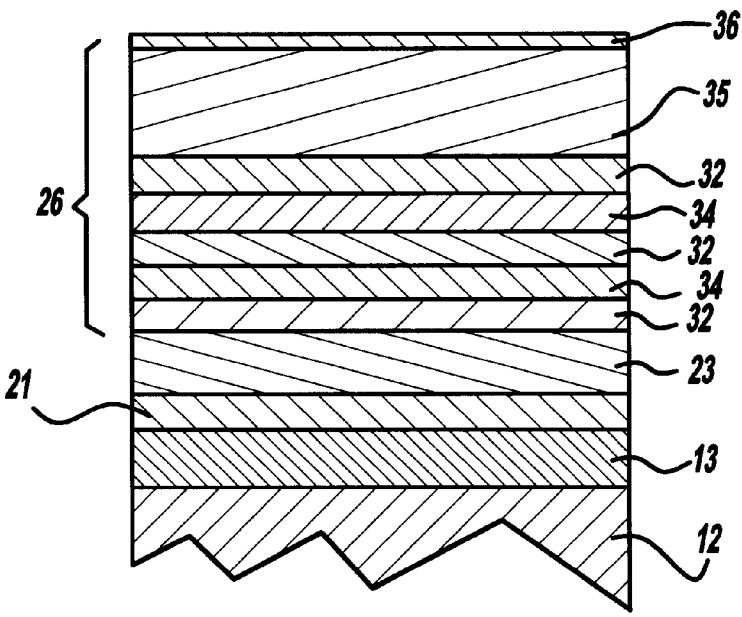
FIG. 1 is a cross-sectional view, not to scale, of a portion of an article having the multi-layer coating on its surface. The coating contains the chrome adhesion promoting layers and the sandwich layer is comprised of layers comprised of refractory metal or refractory metal alloy alternating with layers comprised of refractory metal compounds or refractory metal alloy compounds.

The article or substrate 12 can be comprised of any material such as plastic, ceramic, metal or metallic alloy. In one embodiment it is a metal or metal alloy such as copper, steel, brass, zinc, aluminum, nickel alloys, and the like. In preferred embodiments the substrate is brass or zinc.

Over the surface of the article 12 is deposited a base coat layer 13 comprised of a polymeric material. The polymeric or resinous layer or base coat 13 may be comprised of both thermoplastic and thermoset polymeric or resinous material. These polymeric or resinous materials include the well known, conventional and commercially available polyacrylates, polymethacrylates, polyepoxies, alkyds, polyurethanes, and styrene containing polymers such as polystyrene and styrene-acrylonitrile (SAN), and blends and copolymers thereof.

The polyacrylates and polymethacrylates are polymers or resins resulting from the polymerization of one or more acrylates such as, for example, methyl acrylate, ethyl acrylate, butyl acrylate, 2-ethylhexyl acrylate, etc., as well as the methacrylates such as, for instance, methyl methacrylate, ethyl methacrylate, butyl methacrylate, hexyl methacrylate, etc. Copolymers of the above acrylate and methacrylate monomers are also included within the term "polyacrylates or polymethacrylates" as it appears herein. The polymerization of the monomeric acrylates and methacrylates to provide the polyacrylate resins useful in the practice of the invention may be accomplished by any of the well known polymerization techniques.

The styrene-acrylonitrile resins and their preparation are disclosed, inter alia, in U.S. Pat. Nos. 2,769,804; 2,989,517; 2,739,142; 3,935,152 and 4,291,134, all of which are incorporated herein by reference.

The alkyd resins are disclosed in "Alkyd Resin Technology", Patton, Interscience Publishers, NY, NY, 1962, and in U.S. Pat. Nos. 3,102,866; 3,228,787 and 4,511,692, all of which are incorporated herein by reference.

Polyurethanes are well known in the art and are readily commercially available. Various known polyols and polyisocyanates are used to form polyurethanes. Polyurethanes are described, for example, in Chapter X, Coatings, pp. 453–607 in J.H. Saunders and K.C. Frisch, Polyurethanes: Chemistry and Technology, Part II, Interscience Publishers (NY, 1964), incorporated herein by reference.

Suitable polyurethanes may be prepared in a conventional manner such as by reacting polyols or hydroxylated polymers with organic polyisocyanates in the manner well known in the art. Suitable organic polyisocyanates include, for instance, ethyl diisocyanate; ethylidene diisocyanate; propylene-1, 2-diisocyanate; cyclohexylene-1, 2-diisocyanate; m-phenylene diisocyanate; 2,4-toluene diisocyanate; 2,6-toluene diisocyanate; 3,3'-dimethyl-4, 4'-biphenyl diisocyanate; p,p',p"-triphenylmethane triisoene diisocyanate; 3,3'-diphenyl-4, 4'-biphenylene diisocyanate; 4,4'-biphenylene diisocyanate; 3,3'-dichloro-4, 4-biphenylene diisocyanate; p,p',p"-triphenylmethane triisocyanate; 1,5-mepthalene diisocyanate; furfurylidene diisocyanate or polyisocyanates, in a blocked or inactive form such as bis-phenyl carbamates of 2,4- or 2,6-toluene diisocyanate; p,p"-diphenyl methane diisocyanate; p-phenylene diisocyanate; 1,5-napthalene diisocyanate and the like. It is preferred to use a commercially available mixture of toluene diisocyanates which contains 80 percent 2,4-toluene diisocyanate and 20 percent 2,6-toluene diisocyanate or 4,4-diphenylmethane diisocyanate.

Polyurethanes applied as base coats in accordance with the invention may, of course, be in the form of solutions in suitable solvents such as xylene, toluene, methyl ethyl ketone, butanol, butyl acetate, etc.

Materials for the polyurethane base coats may be supplied in one package or two package prepolymer systems or oil modified systems, etc., all in the manner well known in the industry. Such materials are described for instance in the pamphlet "Urethane Coatings", published by the Federation of Societies for Paint Technology (1970). Radiation-curable urethane coatings may also of course be used.

Some illustrative examples of suitable polyurethane compositions are disclosed in U.S. Pat. Nos. 4,699,814; 4,681,811; 4,703,101; 4,403,003 and 5,268,215, all of which are incorporated herein by reference.

Another suitable type of polyurethane is an acrylic polyurethane. The acrylic polyurethanes are described in U.S. Pat. Nos. 3,558,564; 4,131,571 and 4,555,535, all of which are incorporated herein by reference.

The polyepoxies are disclosed in "Epoxy Resins", by H. Lee and K. Nevill, McGraw-Hill, New York, 1957, and in U.S. Pat. Nos. 2,633,458; 4,988,572; 4,734,468; 4,680,076; 4,933,429 and 4,999,388, all of which are incorporated herein by reference.

These polymeric materials may optionally contain the conventional and well known fillers such as mica, talc and glass fibers.

Some suitable epoxy resins include glycidyl ethers of polyhydric phenols and polyhydric alcohols prepared by the reaction of epichlorohydrin with a compound containing at least one hydroxyl group, such as for example bisphenol-A, carried out under alkaline reaction conditions.

Other suitable epoxy resins can be prepared by the reaction of epichlorohydrin with mononuclear di- and trihydroxy phenolic compounds such as resorcinol and phloroglucinol, selected polynuclear polyhydroxy phenolic compounds such as bis(phydroxyphenyl) methane and 4,4'-dihydroxybiphenyl, or aliphatic polyols such as 1,4-butanediol and glycerol.

These epoxy resins include the glycidyl polyethers of polyhydric phenols and polyhydric alcohols, particularly the glycidyl polyethers of 2,2-bis(4-hydroxyphenyl) propane.

The polymeric or resinous layer or base coat 13 is applied onto the substrate 12 by any of the well known and conventional methods such as dipping, spraying, brushing, electrostatic spraying and electrocoating.

Layer 13 functions, inter alia, to level the surface of the substrate, cover any scratches or imperfections in the surface and provide a smooth and even surface for the deposition of the subsequent layers.

The base coat layer 13 has a dry or cured thickness at least effective to level out the surface of the substrate. Generally, this thickness is from about 0.1 mil to about 10 mils, preferably from about 0.2 mil to about 5 mils, and more preferably from about 0.3 mil to about 1.5 mils.

In one embodiment of the invention, as illustrated in FIG. 1, over the polymeric base coat layer 13 is deposited a thin adhesion promoting chromium layer 21. Layer 21 serves to improve or promote the adhesion of the chromium compound strengthening layer 23 to the polymer base coat layer 20. Layer 21 has a thickness which is at least effective to promote or improve the adhesion of strengthening layer 23 to the polymeric base coat layer 20. This thickness is generally from about 0.005 microns to about 0.2 microns, preferably from about 0.03 microns to about 0.06 microns. The chromium layer 21 is deposited by well known and conventional vapor deposition techniques including physical vapor deposition and chemical vapor deposition.

Physical vapor deposition processes are well known and conventional and include cathodic arc evaporation (CAE) or sputtering, and the like. Sputtering techniques and equipment are disclosed, inter alia, in J. Vossen and W. Kern "Thin Film Processes II", Academic Press, 1991; R. Boxman et al, "Handbook of Vacuum Arc Science and Technology", Noyes Pub., 1995; and U.S. Pat. Nos. 4,162,954, and 4,591,418, all of which are incorporated herein by reference.

Chemical vapor deposition (CVD) is a well known and conventional process. CVD is generally classified into one of three types. The first two are principally predicated upon reactor pressure, and are designated as atmospheric pressure chemical vapor deposition (APCVD) or low pressure chemical vapor deposition (LPCVD). A third category is referred to as plasma enhanced chemical vapor deposition (PECVD).

CVD processes are disclosed, inter alia, in U.S. Pat. Nos. 5,064,686; 4,803,127; 5,782,980; 5,824,365; 5,254,499 and 5,571,572, all of which are incorporated herein by reference.

Over the chromium adhesion-promoting layer 21 is deposited strengthening layer 23 comprising a chromium compound. The chromium compounds include the carbides, carbonitrides and nitrides, with the chromium nitrides being preferred. Other chromium compounds include, e.g., chromium oxide and chromium oxynitride. These compounds and their preparation are conventional and well known. The chromium compound layer 23 functions to provide the coating with mechanical strength without incorporating excessive internal stress. The thickness of the chromium compound layer 23 is a thickness at least effective to provide the coating with mechanical strength. Generally this thickness is from about 0.5 microns to about 10 microns, preferably from about 2 microns to about 5 microns.

The chromium compound layer 23 is deposited by well known and conventional vapor deposition techniques including, but not limited to, reactive sputtering and reactive cathodic arc evaporation. Reactive cathodic arc evaporation and reactive sputtering are generally similar to ordinary sputtering and cathodic arc evaporation except that a reactive gas is introduced into the chamber which reacts with the dislodged target material. Thus, in the case where chromium nitride is the layer 23, the cathode is comprised of chrome and nitrogen is the reactive gas introduced into the chamber.

It is important to minimize the internal stress of the chromium compound such as CrN layer, since the relatively soft polymer underlayer has limited ability to resist buckling of the harder CrN layer. Stress-induced buckling of the CrN film can cause loss of reflectivity due to cracking and surface waviness. It is well known that the internal stress of PVD deposited thin films can be influenced by such process parameters as gas pressure and composition, deposition rate, and substrate bias and temperature. Special substrate biasing techniques such as voltage pulsing or AC or RF power may also be applied. Electrical contact between the biased rack and the growing film is necessary for effectiveness of DC bias techniques. The deposition process parameters may be adjusted appropriately by, for example, observing the amount and direction of curvature of a CrN coating deposited onto a small sample of thin aluminum foil. Sufficiently stress-free CrN films do not cause curling of the aluminum foil.

Chromium-nitrogen thin films generally exist as mixed phase materials comprising CrN, $Cr_2N$, and Cr in proportions depending on the total nitrogen content. In this application the term "chromium nitride" refers to such a mixed phase material with average nitrogen content between about 5 and 50 atomic percent. The nitrogen content of a film influences the hardness, stress, and elastic properties of the film, and may be adjusted experimentally along with layer thickness to optimize performance for particular applications. The nitrogen content of the chromium nitride films according to the present invention is preferably in the range of about 5 to about 50 atomic percent, and more preferably in the range from about 10 to about 30 atomic percent, with the chromium content being from about 70 to about 90 atomic percent.

Figure 2:
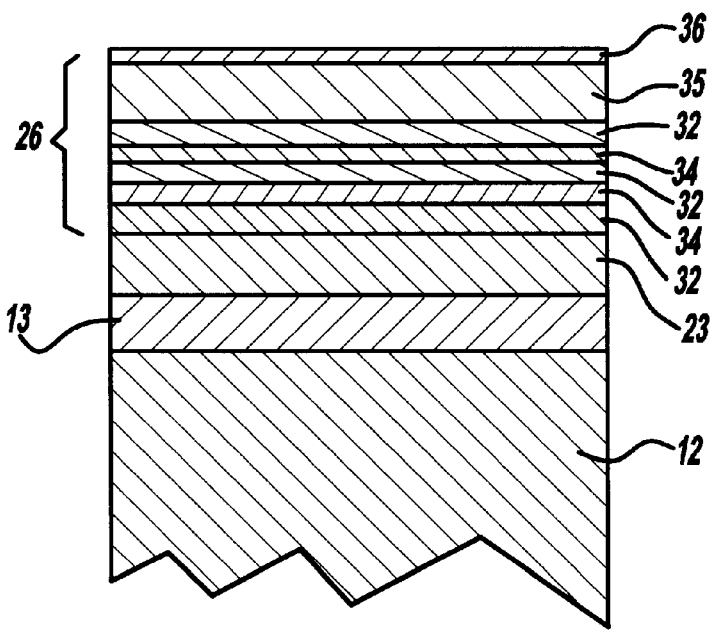
FIG. 2 is similar to FIG. 1 except that there is no chrome adhesion promoting layers between the polymeric base coat and the chromium compound layer.
Figure 3:
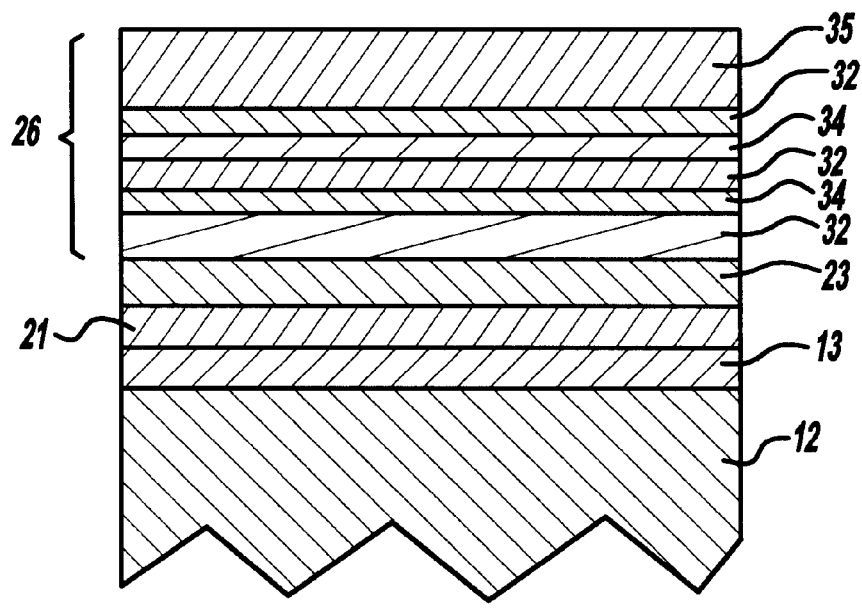
FIG. 3 is similar to FIG. 1 except that the protective, chemical resistant top coat layer is absent.
Figure 4:
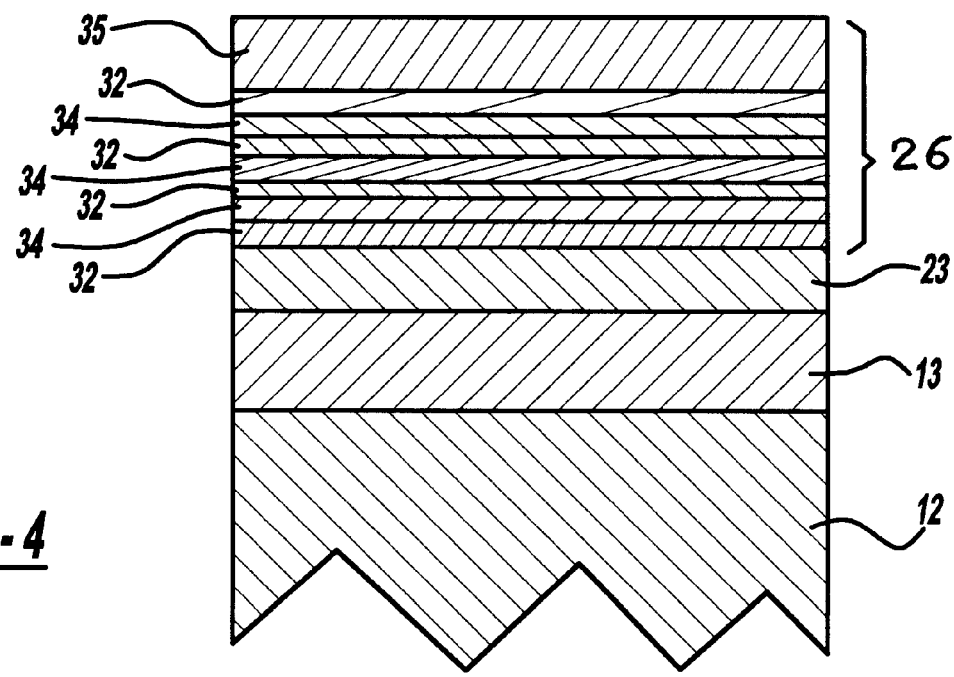
FIG. 4 is similar to FIG. 2 except that the protective, chemical resistant top coat layer is absent.

In another embodiment of the invention, as illustrated in FIG. 2, adhesion promoting chrome layer 21 is absent and the chromium compound layer 23 is disposed on the polymeric layer 13.

Referring again to FIG. 1, deposited over strengthening layer 23 is a sandwich layer 26 comprising a multiplicity of alternating layers of a metal compound or refractory metal alloy compound 34 and a refractory metal or refractory metal alloy 32. A structure wherein refractory metal or refractory metal alloy layers and refractory metal compound layers or refractory metal alloy compound layers form sandwich layer 26 is illustrated in FIG. 1 wherein 34 represents refractory metal compound layers or refractory metal alloy compound layers, and 32 represents refractory metal layer or non-precious refractory metal alloy layers. Refractory metals and metal alloys suitable for layers 32 include zirconium, chromium, titanium, hafnium, tantulum, zirconium-titanium alloy, zirconium-hafnium alloy, titaniumaluminum alloy, and the like. Preferred refractory metals are zirconium, titanium, chromium, and zirconium-titanium alloy. Titanium is considered to be a refractory metal for the purposes of this application, although its melting temperature is slightly below the conventional cutoff of 1,750° C.

The metal compounds and refractory metal alloy compounds suitable for layers 34 include the nitrides, carbides, carbonitrides, oxides, and oxynitrides, with the nitrides being preferred. The preferred compounds include zirconium nitride, chromium nitride, and zirconium-titanium nitride.

The sandwich layer 26 may comprise at least about 4 and up to about 100 layers, and preferably comprises at least about 10 layers and not more than about 50 layers. The total thickness of sandwich layer 26 is generally in the range from about 50 nm to about one micron, and preferably from about 200 nm to about 400 nm.

As best seen in FIG. 1 the sandwich layer is comprised of refractory metal or refractory metal alloy layers and refractory metal compound or refractory metal alloy compound layers. Generally the bottom layer 32 of the sandwich layer 26, i.e., the layer 32 on the chromium compound layer 23, is comprised of refractory metal or refractory metal alloy. The top layer 35 of the sandwich layer is the color layer.

The sandwich layer 26 comprising multiple alternating layers 32 and 34 generally serves to, inter alia, reduce film stress, increase overall coating hardness, improve chemical resistance, and prevent grain boundaries from extending through the entire film thickness, as discussed in part for example in U.S. Pat. 5,948,548 and 5,922,478 (Welty, et al 1999, 1998), both of which are incorporated herein by reference. The alternating layers of refractory metal and compound in the sandwich layer may be deposited by e.g. sputtering or cathodic arc evaporation, using a method in which a flow of reactive gas into the chamber is varied periodically between high and low (or zero) values while the deposition source is operated continuously. For example zirconium may be deposited continuously by cathodic arc evaporation, while a flow of nitrogen is varied periodically between a value sufficient to form a reacted coating of ZrN and a lower value, preferably zero. It is also within the scope of the invention, however, that metal layers 32 have merely a reduced nitrogen content as compared to compound layers 34 rather than being completely free of reacted nitrogen.

Color layer 35 is comprised of a metal, metal alloy, metal compound or a metal alloy compound, preferably a refractory metal, refractory metal alloy, refractory metal compound or a refractory metal alloy compound. Suitable metals include e.g. chromium, titanium, stainless steel, aluminum, tantalum, and hafnium, and also include alloys such as zirconium-titanium, zirconium-hafnium, titaniumaluminum, and the like. Sutiable reacted metal compounds include e.g. the nitrides, carbides, carbonitrides, oxides, oxynitrides, and oxycarbonitrides of the afore-mentioned metals. Preferred metals and compounds for color layer 34' are chromium, stainless steel, zirconium nitride, zirconiumtitanium nitride, and zirconium-titanium carbonitride.

Layer 34' provides the desired color or appearance of the coating and may also contribute to overall wear and abrasion resistance of the coating stack. If layer 34' is e.g. comprised of chromium the substrate will have a "bright chrome" color, while if comprised of zirconium nitride, it will have a color resembling brass. If comprised e.g. of titanium-zirconium alloy nitride it will have a color resembling gold. Color layer 34' has a thickness at least effective to provide the desired color appearance and wear resistance. Generally layer 34' may have a thickness of from about 50 nm to about 1 micron, preferably 300 to 500 nm.

A method of forming the sandwich layer 26 is by utilizing sputtering or cathodic arc evaporation to deposit a layer of chrome, metal or metal alloy such as, for example, zirconium, titanium, or zirconium-titanium alloy, followed by reactive sputtering or reactive cathodic arc evaporation to deposit a layer of chromium compound such as chromium nitride, metal compound such as a nitride metal alloy compound such as a nitride such -as zirconium nitride, titanium nitride or zirconium-titanium alloy nitride.

Preferably the flow rate of nitrogen gas is varied (pulsed) during vapor deposition such as reactive sputtering between zero (no nitrogen gas or a reduced value is introduced) to the introduction of nitrogen at a desired value to form multiple alternating layers of metal and metal nitride in the sandwich layer 26.

Color layer 35 is deposited by any of the well known and conventional vapor deposition techniques such as, for example, sputtering and cathodic arc evaporation when layer 35 is a metal or metal alloy such as chromium, reactive sputtering and reactive cathodic arc evaporation when layer 35 is a metal compound or metal alloy compound such as zirconium nitride or zirconium-titanium alloy nitride.

Reactive cathodic arc evaporation and reactive sputtering are generally similar to ordinary sputtering and cathodic arc evaporation except that a reactive gas is introduced into the chamber which reacts with the dislodged target material. Thus, in the case where zirconium nitride is the layer 34', the cathode is comprised of zirconium and nitrogen is the reactive gas introduced into the chamber. By controlling the amount of nitrogen available to react with the zirconium, the color of the zirconium nitride can be adjusted to be similar to that of brass of various hues.

When chromium nitride is utilized in the multilayer coating it should be understood that chromium-nitrogen thin films generally exist as mixed phase materials comprising CrN, $Cr_2N$, and Cr in proportions depending on the total nitrogen content. In this application the term "chromium nitride" refers to such a mixed phase material with average nitrogen content between about 5 and 50 atomic percent. The nitrogen content of a film influences the hardness, stress, and elastic properties of the film, and may be adjusted experimentally along with layer thickness to optimize performance for particular applications. The nitrogen content of the chromium nitride films according to the present invention is generally in the range of about 5 to about 50 atomic percent, and preferably in the range from about 10 to about 30 atomic percent, with the chromium content in the range of from about 70 to about 90 atomic percent.

Also, when chromium-nitride is used in the present invention it is generally important to minimize the internal stress of the chromium nitride layer, since the relatively soft polymer underlayer has limited ability to resist buckling of the harder chromium nitride layer. Stress-induced buckling of the CrN film can cause loss of reflectivity due to cracking and surface waviness. It is well known that the internal stress of PVD deposited thin films can be influenced by such process parameters as gas pressure and composition, deposition rate, and substrate bias and temperature. Special substrate biasing techniques such as voltage pulsing or AC or RF power may also be applied. Electrical contact between the biased rack and the growing film is necessary for effectiveness of DC bias techniques. The deposition process parameters may be adjusted appropriately by, for example, observing the amount and direction of curvature of a CrN coating deposited onto a small sample of thin aluminum foil. Sufficiently stress-free CrN films do not cause curling of the aluminum foil.

In one embodiment of the invention, as illustrated in FIGS. 1 and 2, a layer 36 comprised of the reaction products of a refractory metal or refractory metal alloy, an oxygen containing gas such as oxygen, and nitrogen (an oxynitride) is deposited onto layer 34'. The metals that may be employed in the practice of this invention are those which are capable of forming both a metal oxide and a metal nitride under suitable conditions, for example, using a reactive gas comprised of oxygen and nitrogen. The metals may be, for example, tantalum, hafnium, zirconium, zirconium-titanium alloy, and titanium, preferably titanium, zirconium-titanium alloy and zirconium.

The reaction products of the metal or metal alloy, oxygen and nitrogen are generally comprised of the metal oxide or metal alloy oxide and metal nitride or metal alloy nitride. Thus, for example, the reaction products of zirconium, oxygen and nitrogen comprise zirconium oxide and zirconium nitride. These metal oxides and metal nitrides including zirconium oxide and zirconium nitride alloys and their preparation and deposition are conventional and well known, and are disclosed, inter alia, in U.S. Pat. No. 5,367,285, the disclosure of which is incorporated herein by reference.

The layer 36 can be deposited by well known and conventional vapor deposition techniques, including reactive sputtering and cathodic arc evaporation.

In another embodiment instead of layer 36 being comprised of the reaction products of a refractory metal or refractory metal alloy, oxygen and nitrogen, it is comprised of refractory metal oxide or refractory metal alloy oxide. The refractory metal oxides and refractory metal alloy oxides of which layer 36 is comprised include, but are not limited to, hafnium oxide, tantalum oxide, zirconium oxide, titanium oxide, and zirconium-titanium alloy oxide, preferably titanium oxide, zirconium oxide, and zirconium-titanium alloy oxide. These oxides and their preparation are conventional and well known.

Layer 36 containing (i) the reaction products of refractory metal or refractory metal alloy, oxygen and nitrogen, or (ii) refractory metal oxide or refractory metal alloy oxide generally has a thickness at least effective to provide improved chemical resistance such as acid resistance. Generally this thickness is at least about 1 nm, preferably at least about 5 nm. The thickness should generally not be greater than about 50 nm, and preferably not greater than about 25 nm in order to avoid changing the color of the color layer or producing interference reflections. Layer 36 may be deposited by vapor deposition process such as reactive cathodic arc evaporation or reactive sputtering.

In order that the invention may be more readily understood the following example is provided. The example is illustrative and does not limit the invention thereto.

EXAMPLE 1

This example illustrates a coating which does not contain a chrome adhesion promoting layer.

Clean faucets are mounted on racks and lowered into a tank of epoxy urethane paint. A voltage is applied to the parts and slowly ramped to negative 100 V relative to anodes on the sides of the tank, while maintaining the current below 1 ampere. The electric charge transferred (Coulombs) should be about 60% of the total by the time negative 100 V is reached. The total charge transferred to the faucet along with the surface area of the faucet determine the final thickness of the paint film. For a single faucet, about 20 to 30 coulombs of charge transfer are required to obtain a paint thickness of about 0.5 mils. The racks are then lifted out of the paint tank and sequentially dipped into a set of three rinse tanks, each subsequent rinse tank containing less paint and more de-ionized water with a resistivity exceeding $10^6$ ohm-cm. Following the last rinse, the faucets are dried in a hot air dryer. Then the patent is cured in two stages. The first stage is at 300° F. for 18 minutes followed by 525° F. for 18 minutes. The racks are then removed from the oven.

The epoxy coated faucets are placed in a deposition chamber incorporating an arc evaporation cathode. The arc source may be fitted with shielding or filtering means to reduce macroparticle incorporation in the coating, as described for example in U.S. Pat. 5,840,163 (Welty) or in copending applications Ser. No. 09/291,343, Linear Magnetron Arc Evaporation Source (Welty), and Ser. No. 09/291,455, Rectangular Filtered Arc Plasma Source (Welty). Sources of argon, oxygen and nitrogen are connected to the chamber through a manifold with adjustable valves for varying the individual rate of flow of each of these gases into the chamber. The cathode is connected to the negative outputs of a variable DC power supply. The positive side of the power supply is connected to the chamber wall. The cathode material comprises chromium. The epoxy coated faucets are disposed in front of the cathode, and may be rotated or otherwise moved during deposition to ensure uniform coating thickness. The faucets are electrically isolated from the chamber and are connected through the mounting rack to the output of a power supply so that a bias voltage may be applied to the substrates during coating. Prior to deposition the vacuum chamber is evacuated to a pressure of about $2 \times 10^{-5}$ torr.

Oxygen gas is then introduced at a rate sufficient to maintain a pressure of about 25 millitorr. The epoxy coated faucets are then subjected to a glow discharge plasma cleaning in which a negative bias voltage of about 500 volts is applied to the rack and epoxy coated faucets. The duration of the cleaning is approximately 5 minutes.

After the glow discharge cleaning, a strengthening layer of chromium nitride is deposited by admitting a flow of nitrogen into the vacuum chamber while operating the arc discharge at a current flow of about 200 amperes. The flow of nitrogen is sufficient to increase the total pressure to around 20 millitorr. A negative voltage bias of 20 volts is applied to the racks and substrates. An additional flow of argon gas is also introduced into the vessel to help stabilize the discharge. The time for deposition of the CrN layer is sufficient to deposit the required thickness, 100 minutes at a deposition rate of 20 nm/min. The maximum deposition rate may be limited by the thermal properties of the particular substrate and the polymer base coating.

After the strengthening CrN layer is deposited, the sandwich layer is deposited by continuing to operate the arc discharge at a current flow of about 200 amperes while pulsing the nitrogen flow on and off (or to some lower value) periodically. The pulsing period is about 60 to 120 seconds (30–60 seconds on/off). The total deposition time for the sandwich layer is about 15 minutes, resulting in a sandwich layer having 20–30 individual layers of around 15–20 nm thickness each. After depositing the sandwich layer, the nitrogen is turned off while the arc discharge continues for another 10 to 15 minutes to deposit the chromium color layer. After the color layer is deposited, a transparent protective layer of chromium oxynitride may be deposited by introducing a gas flow comprising about 80% nitrogen and 20% oxygen (in addition to the previously established argon flow) for a period of about 30–60 seconds. The gas flow should be sufficient to produce a fully reacted transparent layer. The cathode is then turned off, the gas flow turned off, the chamber vented, and the finished substrates removed.

While certain embodiments of the invention have been described for purposes of illustration, it is to be understood that there may be various embodiments and modifications within the general scope of the invention.

What is claimed is:

1. An article having on at least a portion of its surface a coating comprising:
    layer comprised of polymer;
    layer comprised of chromium compound wherein said compound is a nitride, carbide, carbonitride, oxide or oxynitride;
    sandwich layer comprised of plurality of layers comprised of refractory metal compound or refractory metal alloy compound alternating with layers comprised of refractory metal or refractory metal alloy;
    color layer comprised of chrome, metal compound or metal alloy compound.

2. The article of claim 1 wherein said chromium compound is chromium nitride.

3. The article of claim 1 wherein said refractory metal or refractory metal alloy is selected from chromium, zirconium, titanium or zirconium-titanium alloy.

4. The article of claim 3 wherein said refractory metal compound or refractory metal alloy compound is selected from chromium compound, zirconium compound, titanium compound and zirconiumtitanium compound.

5. The article of claim 4 wherein said compound is a nitride.

6. The article of claim 1 wherein a layer comprised of metal oxide or metal alloy oxide is disposed on said color layer.

7. The article of claim 1 wherein a layer comprised of the reaction products of (i) metal or metal alloy, (ii) oxygen and (iii) nitrogen is disposed on said color layer.

8. The article of claim 1 wherein said refractory metal compound or refractory metal alloy compound is selected from chromium compound, zirconium compound, titanium compound and zirconium-titanium alloy compound.

9. The article of claim 8, wherein said compound is a nitride.

10. The article of claim 1 wherein a layer comprised of metal oxide or metal alloy oxide is disposed on said color layer.

11. The article of claim 1 wherein a layer comprised of the reaction products of (i) metal or metal alloy, (ii) oxygen and (iii) nitrogen is disposed on said color layer.

12. An article having on at least a portion of its surface a coating comprising:
    layer comprised of polymer;
    layer comprised of chrome;
    layer comprised of chromium compound wherein said compound is a nitride, carbide, carbonitride, oxide or oxynitride;
    sandwich layer comprised of a plurality of layers comprised of refractory metal compound or refractory metal alloy compound alternating with layers comprised of refractory metal or refractory metal alloy;
    color layer comprised of chrome, metal compound or metal alloy compound.

13. The article of claim 12 wherein said chromium compound is chromium nitride.

14. The article of claim 12 wherein said refractory metal or refractory metal alloy is selected from chromium, zirconium, titanium or zirconium-titanium alloy.

15. The article of claim 14 wherein said refractory metal compound or refractory metal alloy compound is selected from chromium compound, zirconium compound, titanium compound and zirconium-titanium compound.

16. The article of claim 15 wherein said compound is a nitride.

17. The article of claim 12 wherein a layer comprised of metal oxide or metal alloy oxide is disposed on said color layer.

18. The article of claim 12 wherein a layer comprised of the reaction products of (i) metal or metal alloy, (ii) oxygen and (iii) nitrogen is disposed on said color layer.

* * * * *